United States Patent [19]
Mayer et al.

[11] Patent Number: 5,264,108
[45] Date of Patent: Nov. 23, 1993

[54] LASER PATTERNING OF LAMINATED STRUCTURES FOR ELECTROPLATING

[75] Inventors: Steven T. Mayer, San Leandro; Leland B. Evans, Antioch, both of Calif.

[73] Assignee: The United States of America as represented by the United States Department of Energy, Washington, D.C.

[21] Appl. No.: 941,838

[22] Filed: Sep. 8, 1992

[51] Int. Cl.⁵ .............................................. C25D 5/02
[52] U.S. Cl. .................................................. 205/125
[58] Field of Search .............................. 205/122, 125

[56] References Cited

U.S. PATENT DOCUMENTS

| | | | |
|---|---|---|---|
| 3,506,545 | 4/1970 | Garwin et al. | 204/15 |
| 4,217,183 | 8/1980 | Melcher et al. | 204/15 |
| 4,414,059 | 11/1983 | Blum et al. | 156/659.1 |
| 4,448,636 | 5/1984 | Baber | 156/643 |
| 4,574,095 | 3/1986 | Baum et al. | 427/53.1 |
| 4,626,315 | 12/1986 | Kitamoto et al. | 156/628 |
| 4,701,347 | 10/1987 | Higashi | 437/246 |
| 4,842,677 | 6/1989 | Wojnarowski et al. | 156/643 |
| 4,897,150 | 1/1990 | Dooley et al. | 156/628 |
| 4,962,057 | 10/1990 | Epler et al. | 437/81 |
| 4,983,250 | 1/1991 | Pan | 156/628 |
| 5,098,526 | 3/1992 | Bernhardt | 205/125 |

*Primary Examiner*—T. M. Tufariello
*Attorney, Agent, or Firm*—L. E. Carnahan; Roger S. Gaither; William R. Moser

[57] ABSTRACT

A process for laser patterning of a substrate so that it can be subsequently electroplated or electrolessly plated. The process utilizes a laser to treat an inactive (inert) layer formed over an active layer to either combine or remove the inactive layer to produce a patterned active layer on which electrodeposition can occur. The process is carried out by utilizing laser alloying and laser etching, and involves only a few relatively high yield steps and can be performed on a very small scale.

23 Claims, 2 Drawing Sheets

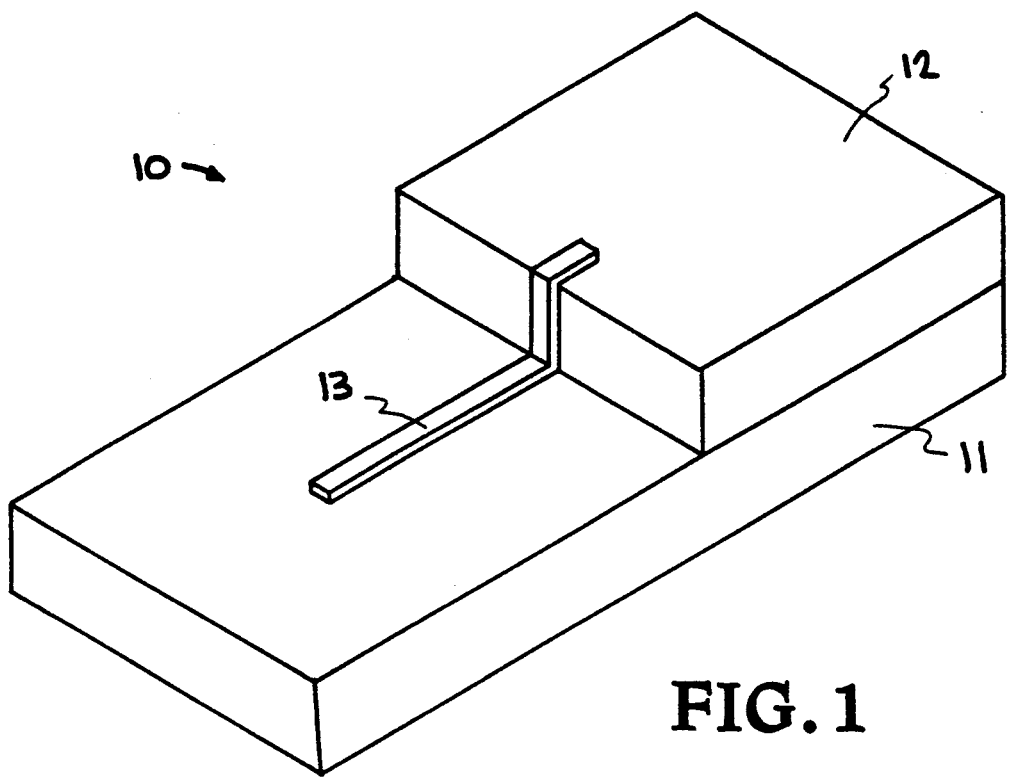
FIG. 1
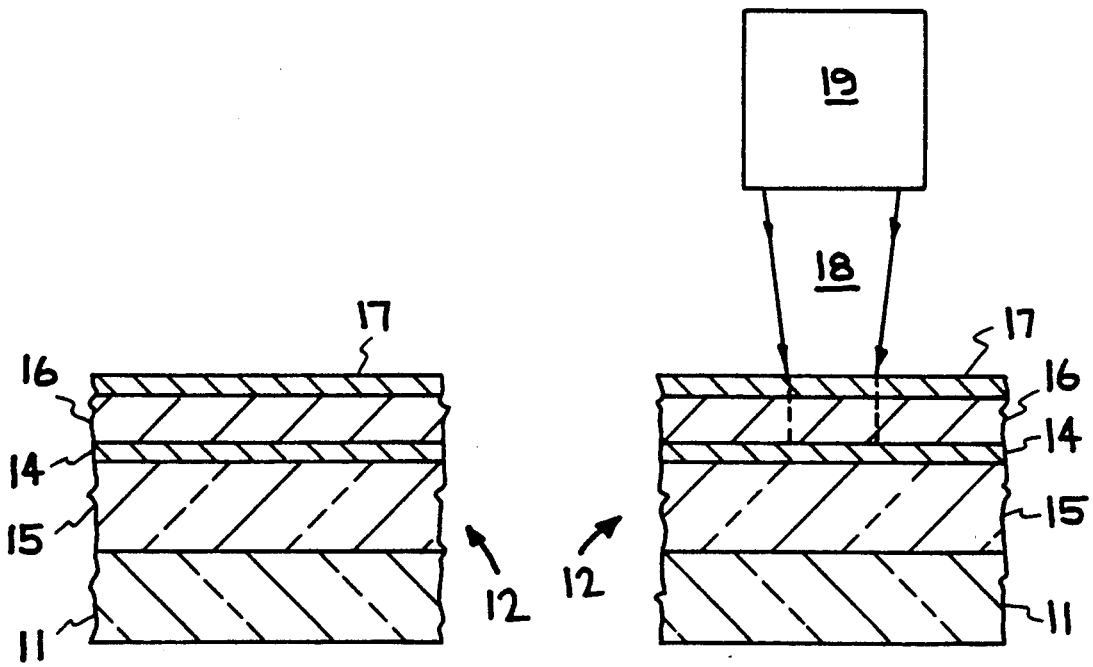
FIG. 2A  FIG. 2B

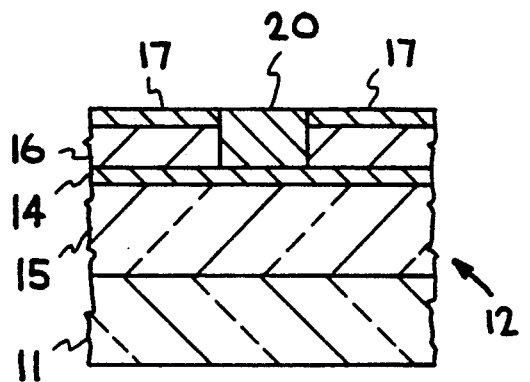
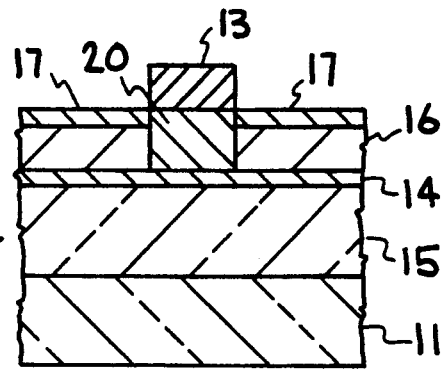
FIG. 2C     FIG. 2D
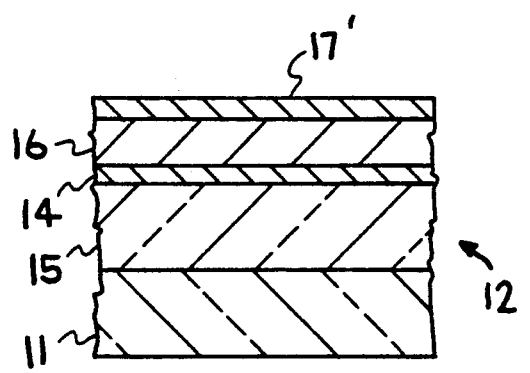
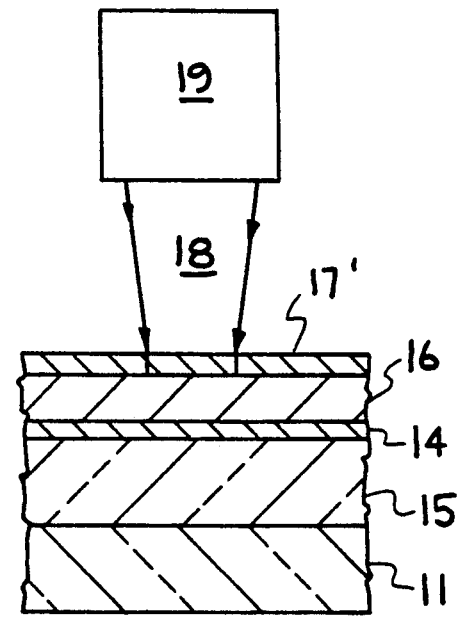
FIG. 3A     FIG. 3B
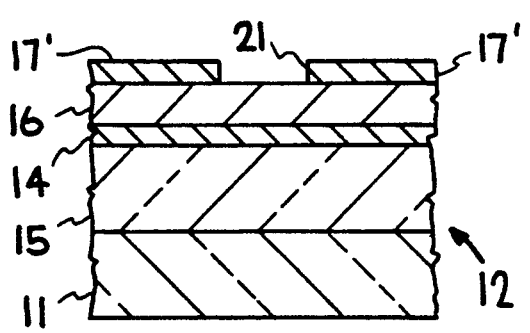
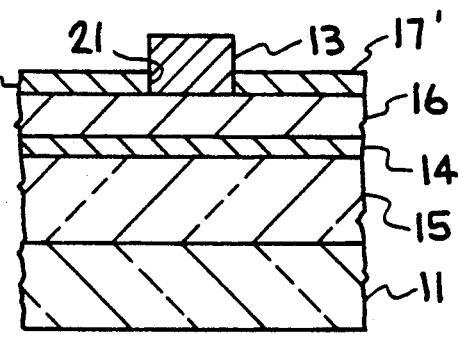
FIG. 3C     FIG. 3D

LASER PATTERNING OF LAMINATED STRUCTURES FOR ELECTROPLATING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to a process for preparing areas of a substrate and/or electronic component for selective metal deposition on the thereon, more particularly to the use of a directed energy source to alter the surface of a substrate and/or electronic component under the exposed energy source from an inactive area to an active area for subsequent selective deposition of a metal on that surface of the substrate and/or component.

Laser and other directed energy sources such as ion and electron beams have been used to deposit and etch materials on surfaces for the purpose of forming localized regions of special chemical properties so as to facilitate the formation of metallic interconnections, such as between integrated circuits. Various prior known techniques for forming interconnections on substrates and components are exemplified by the following.

U.S. Pat. No. 3,506,545 issued Apr. 14, 1970 to R. L. Garwin et al. discloses heating a substrate which has both amorphous and crystalline states, such that heating of the amorphous state locally via a focused and programmed electron beam or laser beam, cause a change to the crystalline state, a higher conductivity state, whereafter electroplating of metallic conductive patterns can be carried out, since the crystalline state is conductive for electroplating current.

U.S. Pat. No. 4,217,183 issued Aug. 12, 1980 to R. L. Melcher et al. discloses a method for locally enhancing electroplating rates wherein the deposition occurs simultaneously with the heating of the substrate by a laser beam or other energy source, due to the heated portion being more readily electroplated than the unheated portion.

U.S. Pat. No. 4,574,095 issued Mar. 4, 1986 to T. H. Baum et al. discloses a process for selectively depositing copper by first selectively depositing palladium seeds on a substrate by irradiating a palladium compound with light, such as a laser, whereafter copper is deposited by an electroless process on the seeded area.

U.S. Pat. No. 4,701,347 issued Oct. 20, 1987 to G. S. Higashi discloses a method for growing patterned metal layers on a substrate by illuminating and heating the substrate with laser light in the presence of a metal-containing gas whereby metal-containing molecules are adsorbed on the substrate, whereafter the metal present on the surface catalyzes the growth of additional metal.

U.S. Pat. No. 4,983,250 issued Jan. 8, 1991 to J. T. Pan discloses a method of laser patterning an electrical interconnect wherein the interconnect is formed by applying an adhesion layer over a substrate, applying an electrical conductor layer over the adhesion layer, and applying a reacting layer over the electrical conductor layer, whereafter a laser beam is directed over the reacting layer in a desired pattern to interdiffuse the reacting and conductor layers and form a reaction product which is used as an etch mask for etching away the reacting, conducting, and adhesion layers located outside the reaction product.

U.S. Pat. No. 5,098,526 issued Mar. 24, 1992 to A. F. Bernhardt, assigned to the assignee of the present application, discloses a process for preparation of a seed layer for selective metal deposition, which involves formation of an initial surface on a substrate comprised of at least two layers with the uppermost layer being an electrical insulator, exposing the formed surface to a source of heat, such as laser energy, in pre-determined places wherein surface activation is desired causing melting and intermixing of the layers, and depositing metal on the activated portions of said surface, thereby forming metallic interconnects on the substrate.

While the above-referenced examples of prior techniques for forming interconnections on substrates and electronic components have produced effective results, there is a continuing need for more efficient and effective methods for the formation of electronic circuits or interconnects for electronic components, which can also be performed on a very small scale. The present invention is directed to fulfilling that need, wherein a surface is altered from an inactive to an active state for subsequent selective deposition of a metal on that altered surface.

SUMMARY OF THE INVENTION

It is an object of the present invention to provide a process for laser patterning of a substrate so that it can be subsequently electroplated or electrolessly plated to form a patterned conductive layer on the substrate.

A further object of the invention is to provide a process capable of altering a selected surface from an inactive to an active area for subsequent selective deposition of a metal on that selected surface.

A still further object of the invention is to provide a process using either laser-alloying or laser-etching for selective deposition of a metal on a surface of a substrate or electronic component.

Another object of the invention is to provide an improved process for metal deposition on a substrate which involves only a few relatively high yield steps and which can be performed on a very small scale.

Another object of the invention is to provide a process which uses a laser, or other directed energy source, to alter the surface under the exposed laser from an inactive to an active area for subsequent selective deposition of a metal on the surface.

The foregoing and other objects and advantages of the present invention will become apparent from the description and drawings to follow.

The present invention basically comprises a method for forming electric circuits or interconnects for components such as integrated circuits. The method involves laser patterning of a substrate and/or electronic component so that it can be subsequently electroplated or electrolessly plated. The advantages of the method of this invention is that it involves only a few relatively high yield steps and can be performed on a very small scale. More specifically, the invention involves the use of a laser, or other directed energy source, to alter the surface exposed to laser energy from an inactive to an active area for subsequent selective deposition of a metal on the active surface area. The method of this invention can be carried out by utilizing either laser-alloying or laser-etching.

BRIEF DESCRIPTION OF THE DRAWINGS

FIG. 1 is a highly magnified perspective view of an electronic component prepared in accordance with the present invention.

FIG. 2A-2D illustrate magnified cross-sections of a portion of the component of FIG. 1 showing the various operational steps for forming the FIG. 1 component using laser-alloying; and FIG. 3A-3D illustrate magnified cross-sections of a portion of the component of FIG. 1 showing the various operational steps for forming the FIG. 1 component using laser-etching.

DETAILED DESCRIPTION OF THE INVENTION

The present invention utilizes a laser, or other directed energy source, to alter the surface of an electronic component exposed to the laser energy from an inactive to an active area for subsequent selective deposition of a metal on the altered surface. The invention involves treatment of a surface having a top or outer layer which is initially electrochemically inactive to metal electrodeposition or electroless deposition. Such surface is either: 1) metallic, and is caused to mix or alloy by laser heating or photochemical reaction to form a single layer which is active to an electroplating or electroless plating process, or 2) is composed of a metallic or insulating material which is "etched" (removed) by a reactive gas or liquid above the substrate which forms a gaseous or liquid product of the top layer material, thereby exposing a lower layer which is electrochemically active, but not etched by this laser process.

The present invention involves a method or process for laser patterning of a substrate or electronic component so that it can be subsequently electroplated or electrolessly plated. Hereinafter the term electrodeposit or electrodeposition refers to both the processes of electroplating and electroless plating. The process of this invention would, for example, allow for the interconnection of integrated circuits (ICs) by writing or forming an interconnect upon an upper or outer surface and/or a side surface of an IC chip containing electronic circuits, as well as on a substrate upon which is positioned the IC chip. The thus formed interconnects may connect the IC chip with other chips or buss lines, for example. The advantage of the present process or method is that it involves only a few relatively high yield steps, can be performed on a very small scale (as small as 0.5 $\mu$m), and may not involve the ablation or incorporation of an insulating compound into a conductive underlying layer as a eutectic or intermetallic compound, as disclosed in above-referenced U.S. Pat. No. 5,098,526 issued in the name of Anthony F. Bernhardt. Incorporation of insulating compounds into the conducting phase, as carried out in U.S. Pat. No. 5,098,526, involves a complicated phenomena of nucleation, growth, diffusion, and wetting, all of which may cause poor characteristics for electrodepositing, due to limited layer conductivity, surface film formation, or phase segregation, and thereby decrease the range of operating conditions for such a process and/or make the process unworkable.

Referring now to the drawings, FIG. 1 illustrates an integrated circuit (IC) component generally indicated at 10 which can be produced in accordance with the method or process of the invention. The component 10 comprises a substrate 11 upon which is positioned an IC chip 12 containing electronic circuits, not shown. A metallic interconnect 13 is connected to IC chip 12 and is adapted for connecting chip 12 with other chips or with a buss line, not shown. The component 10 can be utilized in various applications, such as in computers and other electronic devices.

In carrying out the process or method of fabricating the IC component 10, attention is directed to FIGS. 2A-2D and to FIGS. 3A-3D which illustrate operational steps of two processes, with certain of the operational steps of the two processes being substantially identical. The FIGS. 2A-2D process involve laser-alloying, while the FIGS. 3A-3D process involve laser-etching.

Referring now to FIGS. 2A-2D which illustrate a greatly magnified cross-section of portions of substrate 11 and IC chip 12 of IC component 10, while FIG.2D additional illustrates in cross-section the metallic interconnect 13 of IC component 10. The IC chip 12, illustrated in FIG. 2A is generally similar to the chip of FIG. 2A of above-referenced U.S. Pat. No. 5,098,526, in that it is of a laminated type and includes an adhesion layer 14 nearest to substrate 15 of chip 12, with two layers or films 16 and 17 located over adhesion layer 14. Adhesion layer 14 may, for example, have a thickness of 200 to 800 Angstrom (A), and be a mixture of titanium (30%) and tungsten (70%), and serves to promote adhesion between layer 16 and the substrate 15, which may, for example, be composed of or include a layer of silicon dioxide. Adhesion layer 14 may also be made of pure titanium or chromium, but the titanium-tungsten mixture is preferred because of its higher melting temperature. As pointed out in above-referenced U.S. Pat. No. 5,098,526, the adhesion layer does not alloy or mix with the materials of the outer layers during forming of the metallic interconnect 13.

The first metallic layer or film 16, located adjacent to layer 14, is about 2000 A or greater (2000 A to 15,000 A) in thickness and composed of an electrochemically active material, such as gold, copper and nickel. The material of layer 16 should not form a native oxide or other film that is not readily reducible or removal in either a typical electroplating solution or by a simple wet etch procedure.

Layer or film 17, which may, for example, have a thickness of 400 A to 2000 A, is located above the electroactive layer 16 and is either: 1) a metal which is catalytically inactive for the particular metal which is to be electrodeposited thereon to form interconnect 13, examples of which include titanium (Ti), titanium-tungsten (TiW), tungsten (W), chromium (Cr), amorphous carbon or Glassy Carbon; or 2) an insulating layer of material such as amorphous silicon (a-Si) or silicon oxide ($SiO_2$). The catalytic inactivity of the metal layer 17 can be due to: 1) a very low exchange current density; 2) a large overpotential for deposition on unpatterned metal; 3) a native oxide layer on the unpatterned metal which is not readily reduced and offers a significant voltage drop over the oxide to prohibit electrodeposition there; or 4) some other reason. The insulator layer of which layer 17 may composed must be able to be selectively removed in a gaseous or liquid etchant under illumination by radiation.

All of the layers or films 14, 16 and 17 can be deposited by sputtering, vapor deposition, electrodeposition, or some other known and suitable process. It is to be understood that the laminated structure constituting chip 12 as illustrated in the embodiment of FIG. 2A can be obtained from a supplier, or the layers 14, 16 and 17 may be formed on the substrate 15 by known techniques, such as by sputtering, vapor deposition, plasma enhanced chemical vapor deposition (PECVD), chemical vapor deposition (CVD), electroplating, etc.

Once the laminated structure constituting IC chip 12 of FIG. 2A has been made, the structure can be "laser written", wherein a beam 18 of energy from a laser 19 is directed onto a selected path or pattern on outer layer 17 of chip 12, as illustrated in FIG. 2B. The process illustrated in FIG. 2B-2D is referred to herein as "laser-alloying" wherein the laser 19 simply heats the local surface of chip 12 to a temperature of 300 C. to 2000 C., depending on the materials involved, at which the outermost (inactive) layer 17 and the electroactive metal layer 16, which are exposed to the laser beam 18, form a melt indicated at 20 in the layers 16 and 17, as illustrated in FIG. 2C. After melting, the materials from layers 16 and 17 interdiffuse and the melt 20 may constitute an alloy, or possibly a eutectic, depending on the particular materials of the layers 16 and 17, but which is rich in the electrochemically active material. The melt 20 defines a region to which is subsequently electrodeposited an electrically conductive material, such as copper (Cu), gold (Au) and nickel (Ni), to form interconnect 13, as shown in FIG. 2D. The interconnect 13 may, for example, have a thickness in the range of 2 μm to 20 μm, and a width of 0.5 μm to 100 μm.

EXAMPLE I

The laser-alloying method illustrated in FIGS. 2A-2D is preferably carried out such that a substrate 15, made of silicon (Si), is sputtered with an adhesion layer 14 of either tungsten or titanium-tungsten alloy which is predominantly tungsten and having a thickness of 400 A. Tungsten rich adhesion layers are desired because they melt only at very high temperatures (>3000 C.). Next, a 2000 A thick copper layer 16 is sputtered onto the adhesion layer 14, followed by a 400 A thick layer 17 of chromium or titanium being sputtered onto the copper layer 16. The chromium or titanium layer 17 and the outer surface of copper layer 16 are laser melted by an argon ion laser 19 and thereby forming a melt 20 comprising a resulting eutectic (for the copper/chromium system) or alloy (for the copper/titanium system), on which is electroplated with copper (Cu) to a thickness of 5 μm thereby forming the interconnect 13. The laser-alloying process has the advantage in that it can be performed in air.

Referring now to FIGS. 3A-3D which, like FIGS. 2A-2D illustrate a greatly magnified cross-section of portions of substrate 11 and IC chip 12 of IC component 10 of FIG. 1, while FIG. 3D additionally illustrates in cross-section the metallic interconnect 13 after it is formed on chip 12. The IC chip 12, illustrated in FIG. 3A is similar to chip 12 of FIG. 2A except for the composition of the outer layer of the chip. Like components in FIGS. 3A-3D to those of FIGS. 2A-2D will be given similar reference numerals.

The method of laser patterning illustrated in FIGS. 3A-3D involves the same initial laminated structure using a substrate and three layers of material to form chip 12, as in the method illustrated in FIGS. 2A-2D, except that the outermost layer of the chip is composed of a different material. The method illustrated in FIGS. 3A-3D is referred to herein as "laser-etching", and uses a laser as a localized heating source so as to cause (or increase the relative rate of) etching (removing) a portion of the outermost layer. The gas or liquid used as an etchant must form a gaseous or liquid soluble product of the material being etched and have a significant reaction-rate temperature-dependence so as to make the process competitive with other alternative methods (e.g. with the laser-alloying method discussed above). The outermost material does not necessarily have to melt to react, though if it does, the process may occur as a mixture of the laser-alloying and laser-etching methods.

The embodiment of the IC chip 12 illustrated in FIG. 3A is the same as that of FIG. 2A except that the top or outermost layer 17' is composed of amorphous silicon (a-Si) or silicon oxide ($SiO_2$) having a thickness of 2000 A to 10,000 A. The chip 12 of FIG. 3A is placed in a chamber, not shown, with a window therein so that the chip will be in an etching environment as known in the art. As shown in FIG. 3B, a laser beam 18 from laser 19 is directed onto the desired pattern or location on layer 17 to be etched away, and constitutes a localized heating source to cause or increase the rate of etching. The etchant may be a gas, such as chlorine ($Cl_2$), sulfur hexafluoride ($SF_6$) or Freon, or a liquid, such as dilute HF in water or dilute Cr etch. The rate of etching layer 17' depends on the materials involved and on the laser flux, scan rate, atmospheric pressure and temperature. Layer 17 is etched to remove a section, gap, or pattern thereon 25 indicated at 21 in FIG. 3C, whereafter the interconnect 13 can be electrodeposited onto the active material of layer 16, as shown in FIG. 3D, with interconnect 13 having a thickness of 0.5 μm to 20 μm and a width of 0.5 μm to 100 μm.

As set forth above with respect to the FIG. 2A chip, the laminated structure constituting chip 12 of FIG. 3A may be obtained as illustrated, or the layers 14, 16 and 17' may be formed on the substrate 15, prior to the laser/etching treatment.

EXAMPLE II

The laser-etching method illustrated in FIGS. 3A-3D is preferably carried out such that a substrate 15 is sputtered with an adhesion layer 14 of tungsten rich material, such as a titanium-tungsten alloy, as above described, followed by a sputtered layer 16 of copper, as above described, which is followed by a layer 17' of silicon (a-Si) deposited on copper layer 16 by PECVD with a thickness of 2000 A. The thus formed chip 12 and substrate 11 of FIG. 1 are placed in an appropriate etching chamber for etching of the pattern or section 21 in outer layer 17'. The chamber contains an etching environment of $Cl_2$ gas and the a-Si layer 17' is irradiated by beam 18 of energy from laser 19 which serves as a localized heating source to cause or increase the rate of etching. The laser 19, for example, is of the argon ion type and produces beam 18 of a wavelength of 488 or 514 nm and power of 20 W such that the layer 17' is heated to a temperature where etching occurs. After the layer 17' has been etched as shown in FIG. 3C, the pattern or section 21 is electrodeposited with Cu to form interconnect 13.

While the above description has been directed to the utilization of an argon ion laser, other known heat sources such as a pulsed excimer laser and conventional flash lamps can be used. However, if a flash lamp is to be used, it may be necessary to place a mask over the surface layer which will allow exposure only in those areas of the surface layer in which activation is desired.

It has thus been shown that the present invention provides a process or method of forming on an integrated circuit chip and/or substrate, an interconnect by altering the surface of the chip/substrate via exposure by light energy, such as a laser from an inactive area to an active area, whereupon the interconnect can be electrodeposited on the active area. This can be accomplished via either a laser-alloying technique or a laser-etching technique.

While the foregoing description and illustrations of the preferred embodiments of the invention have been presented for purposes of illustration and description, such are not intended to be exhaustive or to limit the invention to the precise forms, materials, sizes, etc., as many modifications and variations are possible in light of the above teachings. It is intended that the scope of the invention be defined by the claims appended thereto.

We claim:

1. A process for forming a metallic interconnect on an electronic component having at least one layer of electrochemically active material covered by a layer of electrochemically inactive material, comprising the steps of:
   directing localized energy from a source onto a selected area of the layer of inactive material causing heating thereof and elimination of the inactive material only in the area of the localized heating;
   at least exposing the active material normally located under the selected area of the heated inactive material; and
   forming a metallic interconnect on the exposed active material.

2. The process of claim 1, wherein the step of heating of the inactive material is carried out by directing localized laser energy onto the layer of inactive material.

3. The process of claim 2, wherein the step of heating is carried out during an etching operation to remove the selected area of the layer of inactive material.

4. The process of claim 1, wherein the step of heating is carried out during an etching operation to remove the selected area of the layer of inactive material.

5. The process of claim 1, additionally including the step of positioning the component within an etching environment for removing the selected area of the layer of inactive material prior to the step of directing localized energy onto a selected area of the layer of inactive material.

6. The process of claim 1, wherein the step of heating the selected area of the layer of inactive material additionally causes heating of a selected area of the layer of active material located beneath the selected area of the layer of inactive material, causing melting of both the selected areas of the inactive and active material.

7. The method of claim 1, additionally including the steps of forming at least a portion of the electronic component, comprising:
   forming an adhesion layer on a substrate;
   depositing at least one layer of conductive material constituting the active material on the substrate; and
   depositing on the layer of conductive material an outer layer of material constituting the inactive material.

8. The method of claim 7, wherein the step of forming the adhesion layer is carried out by depositing a layer of a tungsten containing material on the substrate.

9. The method of claim 8, wherein the tungsten containing material is selected from the group of tungsten and titanium-tungsten alloy.

10. The method of claim 7, wherein the layer of conductive material is selected from the group consisting of copper, gold and nickel.

11. The method of claim 10, wherein the outer layer is selected from the group consisting of titanium-tungsten, tungsten, chromium, and amorphous carbon.

12. The method of claim 10, wherein the outer layer is selected from the group consisting of a-Si and $SiO_2$.

13. The method of claim 10, wherein the outer layer is formed from a metal which is catalytically inactive relative to the metal forming the metallic interconnect.

14. The method of claim 7, wherein the substrate is formed to include at least a surface of silicon dioxide, and the adhesion layer is formed on the silicon dioxide surface of the substrate.

15. The method of claim 7, wherein the step of heating causes melting of the selected area of the layer of conductive material and the selected area of the outer layer forming a mix thereof to which the metallic interconnect is electrodeposited.

16. The method of claim 7, wherein the step of heating is carried out in an etching environment causing removal of the selected area of the outer layer, and wherein the metallic interconnect is electrodeposited on the selected area of the conductive material.

17. The method of claim 15, wherein the adhesion layer is composed of a tungsten rich material, wherein the conductive material is composed of copper, and wherein the outer layer is selected from the group consisting of chromium and titanium.

18. The method of claim 16, wherein the adhesion layer is composed of a tungsten rich material, wherein the conductive material is composed of copper, and wherein the outer layer is selected from the group consisting of a-Si and $SiO_2$.

19. The method of claim 18, wherein the etching environment utilizes an etchant selected from the group consisting of a gas from the group of $Cl_2$, $SF_6$ and Freon, and a liquid from the group of dilute HF in water and dilute Cr etch.

20. The method of claim 19, wherein the outer layer is composed of a-Si and the etchant is composed of chlorine ($Cl_2$) gas.

21. A process for forming a metallic interconnect on an electronic component having at least one layer of electrochemically active material covered by at least one layer of electrochemically inactive material, comprising the steps of:
   positioning the electronic component within an etching environment;
   directing localized energy from a source onto a selected area of the inactive material causing heating and elimination of the inactive material only in the area of the localized heating;
   at least exposing the active material normally located under the selected area of the heated inactive material; and
   forming a metallic interconnect on the exposed active material.

22. The process of claim 21, additionally including the step of forming the inactive material from the group consisting of a metal which is catalytically inactive with respect to the material of the layer of active material on which it is deposited and an insulating material.

23. The process of claim 22, wherein the metal is selected from the group consisting of titanium, titanium-tungsten, tungsten, chromium, and amorphous carbon; and the insulating material is selected from the group of amorphous silicon and silicon oxide.

* * * * *